United States Patent Office 3,532,538
Patented Oct. 6, 1970

3,532,538

BACTERIOSTATIC CONFORMAL COATING AND METHODS OF APPLICATION

Francis N. Le Doux, Seat Pleasant, and Charles Bland, Jr., Seabrook, Md., assignors to the United States of America as represented by the Administrator of the National Aeronautics and Space Administration

No Drawing. Filed Mar. 30, 1967, Ser. No. 627,599
Int. Cl. H05k *3/28*
U.S. Cl. 117—201 4 Claims

ABSTRACT OF THE DISCLOSURE

Bacteriostatic electronic components and assemblies having a cured epoxy coating thereon, preferably with a coating thickness of from 0.005 to 0.010 inch.

The invention described herein was made by employees of the United States Government and may be manufactured and used by or for the Government for governmental purposes without the payment of any royalties thereon or therefor.

This invention relates to a method for making bacteriostatic electronic components and component assemblies, and to the products made by this method. More particularly, the invention relates to bacteriostatic electronic component assemblies produced by applying a thin coating of a curable epoxy system to such components and assemblies, then curing the system until the coating sets.

With the advent of travel in space, a need has developed to avoid carrying viable bacteria on electronic component assemblies to other planets to hinder the growth and reproduction of both vegetative and sporulative bacteria found on such components, and to restrain the component and assemblies when they are subjected to high vibration levels.

It is an object of this invention to provide a method for producing electronic component assemblies which are bacteriostatic, and thus hinder or substantially prevent the reproduction and growth of vegetative and sporulative bacteria.

Another object is to provide a method for restraining electronic component assemblies which are to be subjected to high vibration levels, such as those encountered during flight at high acceleration in spacecraft.

Still another object is to provide electronic component assemblies having a thin, tough, semi-rigid, bacteriostatic, electrically resistive coating which is readily applied and which restrains the components at high vibration levels.

Other objects and advantages of the invention are apparent from the disclosure and claims.

This invention provides a method for producing bacteriostatic electronic component assemblies comprising applying a thin coating of an epoxy system to the component assemblies and curing the coating to a tough, semi-rigid state. The epoxy system used to coat the components comprises: (1) at least one polymeric epoxy compound; (2) at least one monomeric epoxy compound; (3) at least one polyamide resin; and (4) at least one organic amine.

Electronic components such as diodes, triodes, transistors, modules, etc., may be utilized to make up the assemblies treated by the composition of the instant invention. Such assemblies are generally of rigid printed circuit type although the coating can also be applied to flexible printed circuits.

The polymeric epoxy compounds used in the system are characterized by the presence of epoxy which have the formula

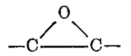

These compounds can be cured to give a solid thermoset, resinous material.

Ordinarily, epoxy resins contain a plurality of terminal epoxy groups and are of moderately high molecular weight containing more than 10, usually more than 20 carbon atoms per molecule.

Epoxy groups can be introduced into organic molecules, particularly cyclic organic compounds, by treatment of an aliphatic double bond with an appropriate oxidizing agent. However, epoxy resins are typically prepared by reaction of a polyfunctional epoxy compound with a polyol, that is, a compound containing two or more hydroxy radicals, producing epoxy resins comprising one or more ether linkages joining organic radicals and terminating in epoxy groups. The epoxy resins used in the manufacture of materials in accordance with the present process will ordinarily be of this description.

A preferred class of epoxy resins are the product of reaction of a polyfunctional epoxy compound with an aromatic polyhydric phenolic compound. The polyfunctional epoxy compound used may be a diepoxide, distinguished from the class of epoxy resins by its relatively low molecular weight, illustrative of which are diepoxybutadiene, bis (2,3-epoxy-2-methylpropyl) ether and the like. Usually, the polyfunctional epoxy compound is a haloepoxy compound such as epichlorohydrin. Reaction of epichlorohydrin, for example, with an aromatic polyhydric phenolic compound results in the formation of a polymer containing ether linkages between arylene radicals derived from the initial aromatic polyhydric compound and hydroxy-alkylene radicals derived from the initial haloepoxy compound, the polymers terminating in epoxyalkoxy radicals. The aromatic polyhydric compound may comprise a monocyclic phenol such as a resorcinol, a polycyclic phenol such as p,p'-(dihydroxy)-biphenyl, a phenolic resin such as a phenolformaldehyde resin, and the like. Particularly preferred are epoxy resins derived from the reaction of epichlorohydrin and bisphenols.

Illustrative of bisphenols which may be employed to produce resins of this type are, for example, p,p'-oxybisphenol, p,p'-methylenebisphenol, 2,2-bis(4-hydroxyphenyl)propane, 2,2-bis(4-hydroxy-2 - methylphenyl)propane, 2,2 - bis(2-t-butyl-4-hydroxyphenyl)propane, 2,2-bis(2,5-dimethyl - 4 - hydrophenyl)propane, 2,2 - bis(2-chloro-4-hydroxyphenyl)propane, 2,2-bis(2 - bromo-6-fluoro-4-hydroxyphenyl)propane, 1,1-bis(4-hydroxyphenyl)ethane, 1,1-bis(4 - hydroxyphenyl)isobutane, 1,1-bis(2-isopropyl-4-hydroxyphenol)isobutane, 2,2 - bis(4-hydroxyphenyl) butane, 4,4-bis(4-hydroxyphenyl)heptane, 1,1-bis(4-hydroxyphenyl)dodecane, 2,2-bis(4 - hydroxyphenyl)hexadecane, and the like.

Another class of epoxy resins useful in the present process comprises aliphatic epoxy resins. Compounds of this nature may, for example be prepared by a process analogous to that employed in preparing an epoxy resin from a bisphenol, with the substitution of an aliphatic polyol for the aromatic hydroxy compound. Illustrative of epoxy resins of this class are reaction products of an epoxy group source such as epichlorohydrin with aliphatic polyols such as triethylene glycol, 1,4-butylene glycol, hexamethylene glycol, octaethylene glycol, glycerol, sorbitol and the like.

In general, aliphatic chains produce more flexible resins than aromatic, and mixed aliphatic and aromatic chains may alternatively be introduced into an epoxy resin, using the aforedescribed procedures, producing resins of modified properties.

As mentioned above, epoxidized cycloaliphatic compounds such as diepoxide of diethylene glycol bisdihydrodisyclopentadienyl ether, are also within the class of epoxy resins curable to thermoset resinous products.

In commercial epoxy resins the number of times the repeated unit of the polymer chain recurs will vary from molecule to molecule. In general, any commercial resin will represent a mixture of resins of varying chain lengths corresponding to a varying number of repeated units. Compared to other widely-used resin products, the epoxy resins are of relatively low molecular weight. Such resins are nevertheless designated as polymeric, however, with reference to the duplication of chain units in the molecule, and to the at least partial content of polymeric molecules usually present. Furthermore, though ideally the resin molecule contains two epoxy groups per molecule, in practice it is found that the resinous products have a varying average number of epoxy groups per molecule. The epoxy group content of such resins is conventionally expressed as the epoxide equivalent, which refers, to the grams of resin containing a gram equivalent of epoxide. The epoxide equivalent of a commercial resin is generally expressed as a range, such as 125–175, 150–200, etc. Epoxy resins having low epoxide equivalents, below about 250, are preferred because of the lower viscosity of such resins.

The monomeric epoxy compound has a low molecular weight and contains a single epoxy group. By using up to about 25% by weight of the monomeric epoxy based on the total weight of the epoxy system, the viscosity of the system is reduced but the strength of the thermoset system is not impaired. Examples of such monomeric epoxy are: aliphatic compounds like allyl glycidyl ether, aromatic compounds like phenyl glycidyl ether, glycidylbenzene, and styrene oxide (1,2-epoxyethylbenzene) hydroxyalkyl glycidyl ethers such as 2-hydroxyethylglycidyl ether, and mixtures thereof.

The polyamides used in this composition are condensation products of a polymerized long chain fatty acid compound, such as dimerized or trimerized vegetable oils or unsaturated fatty acids, with an aryl or alkyl polyamine. Illustrative of such materials are the condensation products of a polymerized (dimerized or trimerized) fatty acid such as dimerized linoleic acid or polymerized vegetable oil such as dimerized linseed oil with an amine such as ethylene-diamine. When used with organic amines, polyamide curing agents offer several advantages. Greater flexibility and impact resistance can be obtained in the final product. As the reaction of this invention is exothermic, the low volatility of the polyamide compounds is of great value. With the exothermic nature of such reactions, it is possible for the build-up of heat in large masses of reacting materials to exceed the decomposition temperature of one or more of the ingredients, resulting in weak or discolored end product. Because the polyamides are less highly reactive than organic amines, the exotherm of the reaction can be partially controlled by use of increased proportions of polyamides to organic amines as the mass of the reacting resin is increased.

The organic amines used in the epoxy system are, for example, selected from polyamines and tertiary amines such as benzyl dimethyl amine. Illustrative of polyamines are N,N-diethylethylenediamine, ethylenediamine, diethylenetriamine, triethylenetetramine, N - (hydroxyethyl) diethylenetriamine, phenylenediamine and the like. Aliphatic polyamines of the formula $H[HNC_2H_2]_xNH_2$, where $x$ is a whole number, are preferred, particularly preferred being polyalkylenepolyamines such as triethylenetetramine, combining high reactivity with epoxy resins with low volatility.

In general, the polyamide and organic amine should comprise from about 5 to 15% by weight of the epoxy system but may broadly vary from 1% or less to 50% or more by weight of the epoxy system. Generally, sufficient polyamide and organic amine should be used to supply at least one reactive site for each epoxy group present in the resin. In practice an amount somewhat in excess of the theoretical requirement should be used.

The epoxy system is prepared by mixing the four ingredients in the desired proportions in any desired order and is applied to the electronic components by brushing, dipping or spraying. When the components are completely coated, the excess coating material is permitted to drain off before curing is initiated. Depending upon the nature of the four ingredients heating may or may not be necessary to initiate and/or complete cure. If desired, heating may be employed to accelerate curing provided the components can withstand the temperature.

More than one coat can be applied to an individual component or assembly by repeating the steps described above, but each layer should be only partially cured before applying the next layer, as described in Example I. The finished product preferably has a coating thickness of from 0.005 to 0.010 inch.

As shown in the examples, the electronic components are usually cleaned and decontaminated before coating with one or more of the following substances: 2-propanol, n-propanol, n-butanol, 2-butanol, amyl alcohol, mixtures thereof, and the like.

The following examples indicate the ease of application and the durability of the coatings used to make bacteriostatic, vibration resistant electronic components.

EXAMPLE I

A mixture was prepared containing the following components:

64% epoxy resin with epoxide equivalent of 175–195 (Epon 815, Shell Chemical Company)
12% polyamide resin (Versamid 125, General Mills, Kankakee, Ill.)
20% allyl glycidyl ether (as sold by Shell Chemical Company)
4% aromatic amine curing agent (Shell "Z" Curing Agent, Shell Chemical Company).

The ingredients were proportional by weight in the percentages shown and thoroughly mixed together for several minutes or until a homogenous mixture was obtained. This mixture was employed to coat electronic cords and components used in spacecraft. The electronic component assemblies were thoroughly cleaned and decontaminated in a bath of 2-propanol and then preheated to 115° F.–125° F. prior to applying the coating material. The coating may be applied in several ways, such as brushing, dipping or spraying, depending on the particular electronic assemblies to be coated and convenience. When the electronics are completely coated the excess coating material is allowed to drain off before the curing cycle is initiated. The cure for the coating material in this application may be accomplished by hanging the electronic cards in a forced air circulating oven preheated to 115° F.–125° F. This procedure will cure the coating in approximately 2–3 hours.

A higher curing temperature may be employed if the electronic components involved can withstand the higher curing temperatures. The coating thickness achieved in this procedure will be approximately 0.005 inch to 0.010 inch. A thicker final coating may be obtained by applying additional coats in the manner previously described, but allowing only 30 minutes cure time in the oven prior to each succeeding application of the material. A final cure of approximately 2 to 3 hours is effected when a desirable thickness has been obtained.

EXAMPLE II

This example describes a system which will cure at ambient or room temperature of approximately 75° F. if a heat cure is not desired. A mixture was prepared containing the following ingredients:

62% epoxy resin with an epoxide equivalent of 180–195 (Epon 820, Shell Chemical Company)
15% polyamide resin (Versamid 140, General Mills, Kankakee, Ill.)

20% allyl glycidyl ether
3% diethylenetriamine (Shell Chemical Company).

This mixture was thoroughly mixed and applied to the electronic components as described in Example I. The curing cycle for this mixture may be effected at room temperature (75° F.) for approximately 6 to 8 hours, or, in an oven, at 115° F.–125° F. for 2 hours.

Components coated in the manner described in the examples showed bacteriostasis (as determined by standard techniques) for:

(a) *Bacillis subtilis* var. *niger*
(b) *Staphylococcus Aureus*
(c) *Pseudomonas alcaligenes*
(d) coxynebactenium spp.

From the foregoing description it will be evident that numerous variations and modifications can be made in the present process without departure from the invention.

What is claimed is:

1. Method of making bacteriostatic electronic components and assemblies comprising coating said components and assemblies with a mixture consisting essentially of (1) at least one polymeric epoxy compound; (2) at least one monomeric epoxy compound; (3) at least one polyamide resin; and (4) at least one organic amine.

2. The method of claim 1 wherein said coating has a thickness within the range of from 0.005 to 0.010 inch.

3. The coating composition of claim 4, in a cured state, being of a thickness of from 0.005 inch to 0.010 inch.

4. A low viscosity coating composition particularly adaptable for space application in encapsulating electronic components and assemblies thereof, characterized in its cured state in possessing bacteriostatic qualities and forming a strong, semi-rigid system having the ability to restrain said electronic components when subjected to flight vibration, said coating composition made from a mixture consisting essentially of: (1) at least one polymeric epoxy compound; (2) at least one monomeric epoxy compound; (3) at least one polyamide resin; and (4) at least one organic amine.

References Cited

UNITED STATES PATENTS

| | | | |
|---|---|---|---|
| 3,055,777 | 9/1962 | Grad ---------- | 117—161 XR |
| 3,251,708 | 5/1966 | Schmetterer et al. - | 117—161 XR |

WILLIAM L. JARVIS, Primary Examiner

U.S. Cl. X.R.

117—161; 260—834